US006766150B1

(12) United States Patent
Johnson

(10) Patent No.: US 6,766,150 B1
(45) Date of Patent: Jul. 20, 2004

(54) SYSTEM AND METHOD FOR TUNING A NARROWBAND CAVITY FILTER USED IN A CDMA TRANSMITTER

(75) Inventor: Mitchell K. Johnson, McKinney, TX (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/578,211

(22) Filed: May 24, 2000

(51) Int. Cl.[7] ................................................. H04B 1/40
(52) U.S. Cl. ......................... 455/87; 455/125; 455/120
(58) Field of Search ................................. 455/121, 125, 455/87, 120, 108, 110, 127.2, 339, 122, 123, 124; 333/235, 231, 227, 17.1; 375/304

(56) References Cited

U.S. PATENT DOCUMENTS

| | | | | |
|---|---|---|---|---|
| 3,891,926 A | * | 6/1975 | Ishman et al. | 455/108 |
| 5,739,731 A | * | 4/1998 | Hicks et al. | 333/17.1 |
| 6,246,727 B1 | * | 6/2001 | Larsson et al. | 375/304 |
| 6,347,222 B1 | * | 2/2002 | Niemela | 455/339 |
| 6,545,559 B2 | * | 4/2003 | Cullbom et al. | 333/17.1 |
| 6,580,900 B1 | * | 6/2003 | Edstrom | 455/125 |

* cited by examiner

*Primary Examiner*—Lee Nguyen
*Assistant Examiner*—Lewis West

(57) ABSTRACT

There is disclosed a system for tuning a tunable narrowband cavity filter in a base station transmitter of a wireless network. The radio frequency (RF) transmitter comprises: 1) modulation circuitry for modulating an input baseband signal to produce a first RF signal; 2) amplification circuitry for amplifying the first RF signal; 3) a tunable narrowband cavity filter for filtering the amplified first RF signal and transmitting the filtered and amplified first RF signal to an antenna coupled to an output of the tunable narrowband cavity filter; and 4) a system for tuning the tunable narrowband cavity filter. The system for tuning the tunable narrowband cavity filter comprises: a) a filter calibration signal injection circuit for combining an input calibration signal with the input baseband signal; and b) a filter calibration circuit coupled to the output of the tunable narrowband cavity filter for detecting an RF output calibration signal corresponding to the input calibration signal, determining a signal level of the RF output calibration signal, and adjusting a center frequency of a pass band of the tunable narrowband cavity filter in response to the signal level determination.

24 Claims, 6 Drawing Sheets

SYSTEM AND METHOD FOR TUNING A NARROWBAND CAVITY FILTER USED IN A CDMA TRANSMITTER

TECHNICAL FIELD OF THE INVENTION

The present invention is directed, in general, to wireless communications systems and, more specifically, to a system and method for tuning a narrowband cavity filter in an RF transmit path of a CDMA transmitter.

BACKGROUND OF THE INVENTION

In order to increase the number of subscribers that can be serviced in a single wireless network, frequency reuse is maximized by making individual cell sites smaller and using a greater number of cell sites to cover the same geographical area. Accordingly, the greater number of base transceiver stations increases infrastructure costs. To offset this increased cost, wireless service providers continually implement any improvements that may reduce equipment costs, maintenance and repair costs, and operating costs, or that may increase service quality and reliability, and the number of subscribers that the cellular system can service.

One opportunity for obtaining cost improvement in base transceiver stations involves reducing filter costs on the output of a power amplifier in a base station transmitter of a wireless network. Prior art transmitters use either fixed narrow bandwidth filters or fixed wide bandwidth filters. Such filters are placed on the output of a power amplifier in a CDMA transmitter to reject adjacent channel products (ACP) that are generated by the power amplifier, to reject transmitter noise that falls in the receive band, and to meet operating standards for inband and out-of-band requirements. Fixed wide bandwidth filters have the disadvantage that they cannot efficiently reject adjacent channel products. Although the fixed narrow bandwidth filters can effectively reject adjacent channel products, the fixed narrow bandwidth filters are channel specific and must be individually selected and installed in each transmitter to meet specific customer requirements. For example, in one transmit channel within the 1930 Hz to 1990 MHz range of an IS-95 compliant CDMA wireless network, the output filter requires approximately fifty (50) different individual output filters to configure a particular base transceiver station for operation.

Therefore, there is a need for an improved base transceiver station having less expensive filters and having a lower level of power consumption. In particular, there is a need to reduce the number of filters that are used on the output of the power amplifier in a base transceiver station. More particularly, there is a need to reduce the number of filters that are used on the output of the power amplifier in a base transceiver station while still providing coverage for the full dynamic range of the RF transmitter.

SUMMARY OF THE INVENTION

To address the above-discussed deficiencies of the prior art, it is a primary object of the present invention to provide a system and method for tuning a tunable narrowband cavity filter in a base station transmitter of a wireless network. In an advantageous embodiment of the present invention, the radio frequency (RF) transmitter comprises: 1) modulation circuitry capable of modulating an input baseband signal to produce a first RF signal; 2) amplification circuitry capable of amplifying the first RF signal; 3) a tunable narrowband cavity filter capable of filtering the amplified first RF signal and transmitting the filtered and amplified first RF signal to an antenna coupled to an output of the tunable narrowband cavity filter; and 4) a system for tuning the tunable narrowband cavity filter. The system for tuning the tunable narrowband cavity filter comprises: a) a filter calibration signal injection circuit capable of combining an input calibration signal with the input baseband signal; and b) a filter calibration circuit coupled to the output of the tunable narrowband cavity filter capable of detecting an RF output calibration signal corresponding to the input calibration signal, determining a signal level of the RF output calibration signal, and adjusting a center frequency of a pass band of the tunable narrowband cavity filter in response to the signal level determination.

According to one embodiment of the present invention, the filter calibration signal injection circuit comprises a signal source capable of generating the input calibration signal; a first summation circuit coupled to the signal source capable of combining the input calibration signal with an in-phase baseband signal to produce a first summed signal; and a second summation circuit coupled to the signal source capable of combining the input calibration signal with a quadrature baseband signal to produce a second summed signal.

According to another embodiment of the present invention, the modulation circuitry combines and modulates the first and second summed signals to produce the first RF signal.

According to still another embodiment of the present invention, a level of the input calibration signal is at least 40 dB lower than a level of the in-phase baseband signal and wherein the level of the input calibration signal is at least 40 dB lower than a level of the quadrature baseband signal.

According to yet another embodiment of the present invention, the filter calibration circuit comprises an RF mixer capable of receiving the RF output calibration signal from the tunable narrowband cavity filter and demodulating the. RF output calibration signal to produce a demodulated baseband calibration signal; and a filter calibration controller capable of receiving the demodulated baseband calibration signal, determining a signal level of the demodulated baseband calibration signal, and adjusting the center frequency of the pass band of the tunable narrowband cavity filter according to the signal level of the demodulated baseband calibration signal.

According to a further embodiment of the present invention, the RF output calibration signal comprises an upper RF calibration signal disposed at approximately X Hz above a center frequency of the filtered and amplified first RF signal and a lower RF calibration signal disposed at approximately X Hz below the center frequency of the filtered and amplified first RF signal.

According to a still further embodiment of the present invention, the RF mixer demodulates the upper and lower RF calibration signals to produce the demodulated baseband calibration signal, wherein the signal level of the demodulated baseband calibration signal is proportional to a combined signal level of the upper and lower RF calibration signals.

According to a yet further embodiment of the present invention, the filter calibration controller adjusts the center frequency of the pass band of the tunable narrowband cavity filter to minimize the signal level of the demodulated baseband calibration signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless network.

Figure 1:
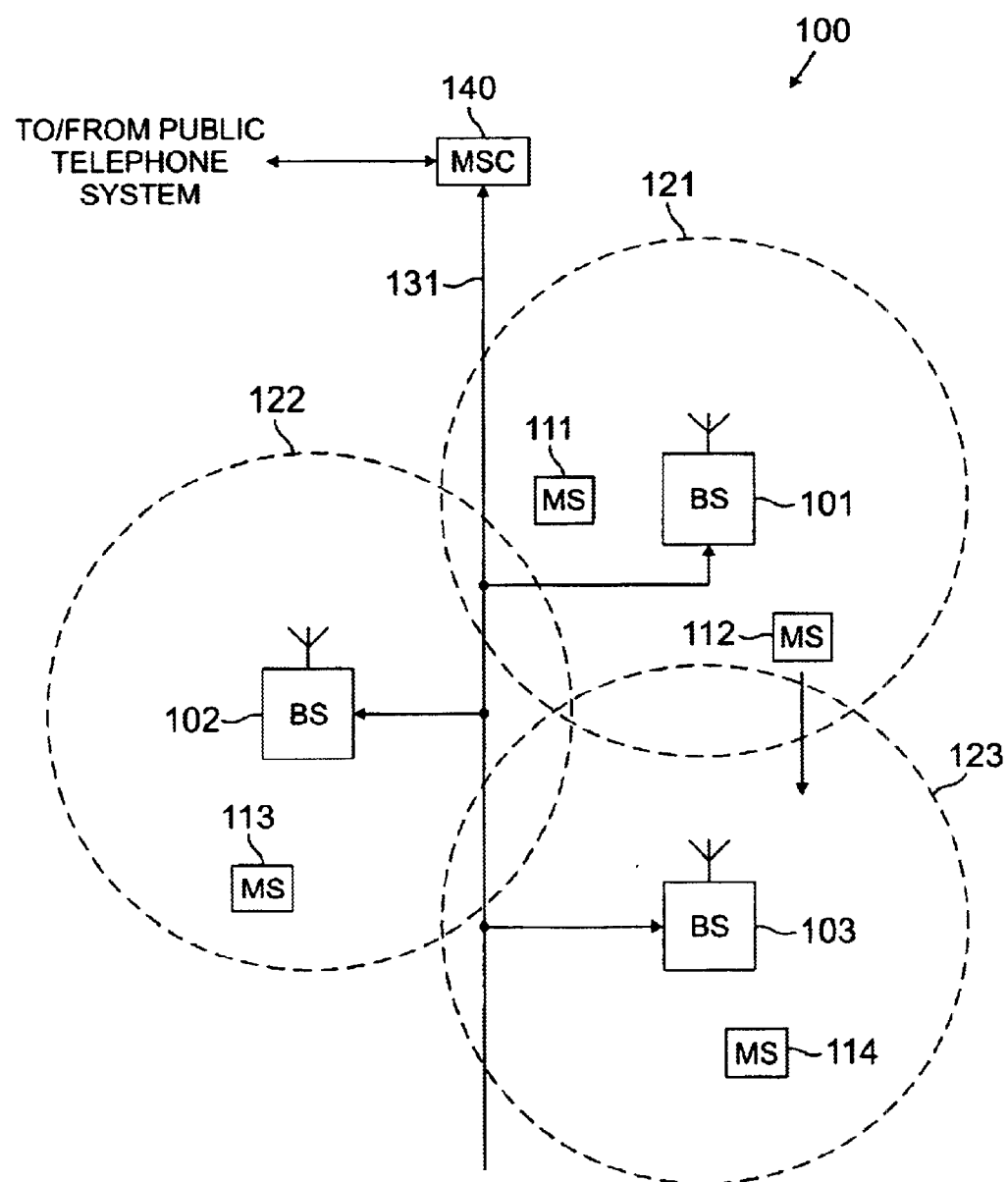
FIG. 1 illustrates an exemplary wireless network in accordance with an advantageous embodiment of the present invention.

FIG. 1 illustrates an exemplary wireless network 100 according to one embodiment of the present invention. The wireless telephone network 100 comprises a plurality of cell sites 121–123, each containing one of the base stations, BS 101, BS 102, or BS 103. Base stations 101–103 are operable to communicate with a plurality of mobile stations (MS) 111–114. Mobile stations 111–114 may be any suitable cellular devices, including conventional cellular telephones, PCS handset devices, portable computers, metering devices, and the like.

Dotted lines show the approximate boundaries of the cell sites 121–123 in which base stations 101–103 are located. The cell sites are shown approximately circular for the purposes of illustration and explanation only. It should be clearly understood that the cell sites may have other irregular shapes, depending on the cell configuration selected and natural and man-made obstructions.

In one embodiment of the present invention, BS 101, BS 102, and BS 103 may comprise a base station controller (BSC) and a base transceiver station (BTS). Base station controllers and base transceiver stations are well known to those skilled in the art. A base station controller is a device that manages wireless communications resources, including the base transceiver station, for specified cells within a wireless communications network. A base transceiver station comprises the RF transceivers, antennas, and other electrical equipment located in each cell site. This equipment may include air conditioning units, heating units, electrical supplies, telephone line interfaces, and RF transmitters and RF receivers, as well as call processing circuitry. For the purpose of simplicity and clarity in explaining the operation of the present invention, the base transceiver station in each of cells 121, 122, and 123 and the base station controller associated with each base transceiver station are collectively represented by BS 101, BS 102 and BS 103, respectively.

BS 101, BS 102 and BS 103 transfer voice and data signals between each other and the public telephone system (not shown) via communications line 131 and mobile switching center (MSC) 140. Mobile switching center 140 is well known to those skilled in the art. Mobile switching center 140 is a switching device that provides services and coordination between the subscribers in a wireless network and external networks, such as the public telephone system. Communications line 131 may be any suitable connection means, including a T1 line, a T3 line, a fiber optic link, a network backbone connection, and the like. In some embodiments of the present invention, communications line 131 may be several different data links, where each data link couples one of BS 101, BS 102, or BS 103 to MSC 140.

In the exemplary wireless network 100, MS 111 is located in cell site 121 and is in communication with BS 101; MS 113 is located in cell site 122 and is in communication with BS 102; and MS 114 is located in cell site 123 and is in communication with BS 103. The MS 112 is also located in cell site 121, close to the edge of cell site 123. The direction arrow proximate MS 112 indicates the movement of MS 112 toward cell site 123. At some point, as MS 112 moves into cell site 123 and out of cell site 121, a "handoff" will occur.

As is well known, the handoff procedure transfers control of a call from a first cell to a second cell. For example, if MS 112 is in communication with BS 101 and senses that the signal from BS 101 is becoming unacceptably weak, MS 112 may then switch to a BS that has a stronger signal, such as the signal transmitted by BS 103. MS 112 and BS 103 establish a new communication link and a signal is sent to BS 101 and the public telephone network to transfer the on-going voice, data, or control signals through BS 103. The call is thereby seamlessly transferred from BS 101 to BS 103. An "idle" handoff is a handoff between cells of a mobile device that is communicating in the control or paging channel, rather than transmitting voice and/or data signals in the regular traffic channels.

Figure 2:
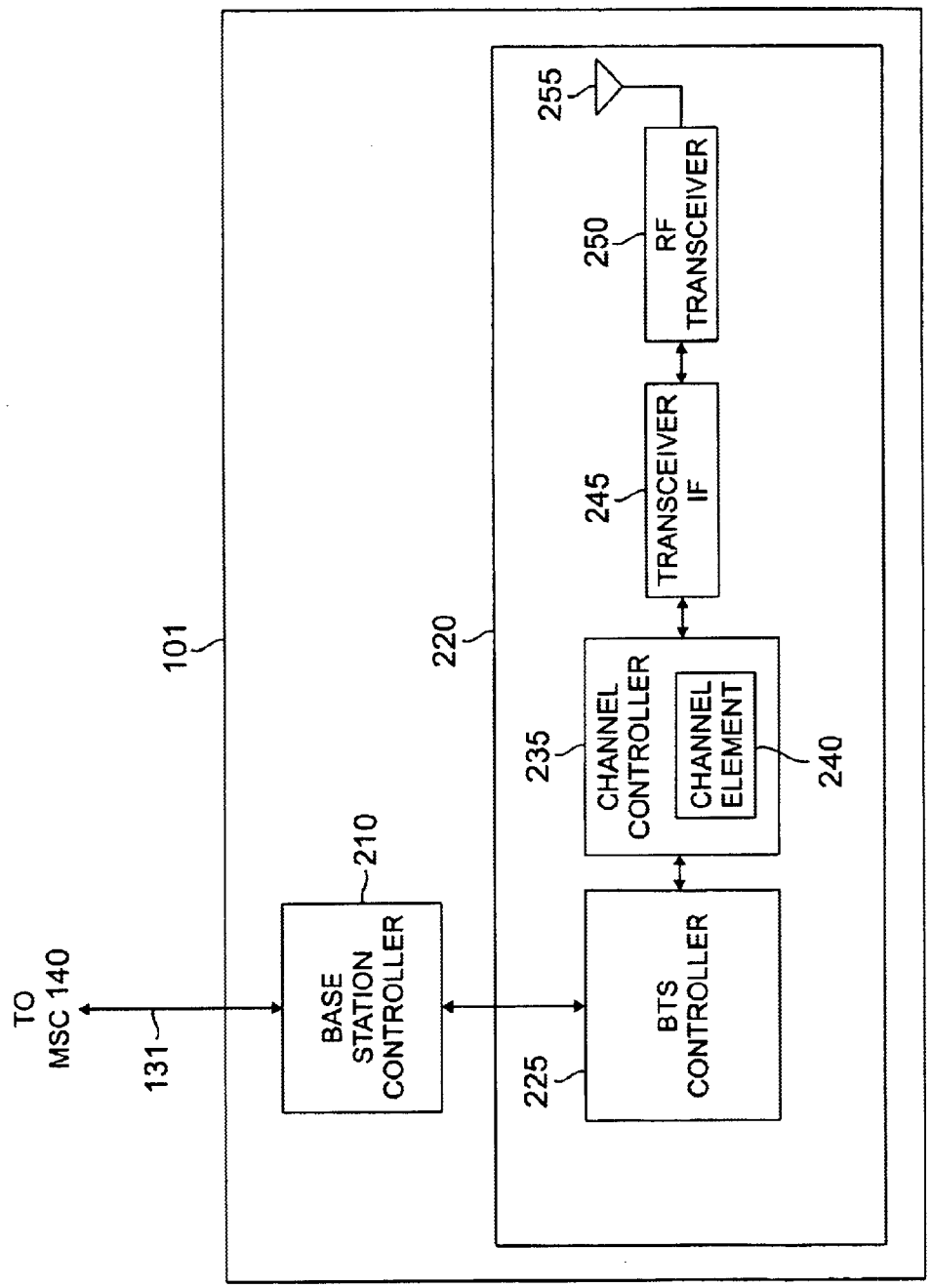
FIG. 2 illustrates in greater detail an exemplary base station in accordance with an advantageous embodiment of the present invention.

FIG. 2 illustrates in greater detail exemplary base station 101 in accordance with one embodiment of the present invention. Base station 101 comprises base station controller (BSC) 210 and base transceiver station (BTS) 220. Base station controllers and base transceiver stations were described previously in connection with FIG. 1. BSC 210 manages the resources in cell site 121, including BTS 220. BTS 220 comprises BTS controller 225, channel controller 235, which contains representative channel element 240, transceiver interface (IF) 245, RF transceiver unit 250, and antenna array 255.

BTS controller 225 comprises processing circuitry and memory capable of executing a program that controls the overall operation of BTS 220 and communicates with BSC 210. Under normal conditions, BTS controller 225 directs the operation of channel controller 235, which contains a number of channel elements, including channel element 240, that perform bi-directional communications in the forward channel and the reverse channel. A "forward" channel refers to outbound signals from the base station to the mobile station and a "reverse" channel refers to inbound signals from the mobile station to the base station. In an advantageous embodiment of the present invention, the channel elements, including channel element 240, operate according to a code division multiple access (CDMA) protocol with the mobile stations in cell 121. Transceiver IF 245 transfers the bi-directional channel signals between channel controller 235 and RF transceiver unit 250.

Antenna array 255 transmits forward channel signals from RF transceiver unit 250 to mobile stations in the coverage area of BS 101 (i.e., in cell 121). Antenna array 255 also sends to RF transceiver unit 250 reverse channel signals received from mobile stations in the coverage area of BS 101. In a preferred embodiment of the present invention, antenna array 255 is multi-sector antenna, such as a three sector antenna in which each antenna sector is responsible for transmitting and receiving in a one hundred twenty degree (120°) arc of coverage area. Additionally, RF transceiver unit 250 may contain an antenna selection unit (not shown) to select among different antennas in antenna array 255 during both transmit and receive operations.

Figure 3:
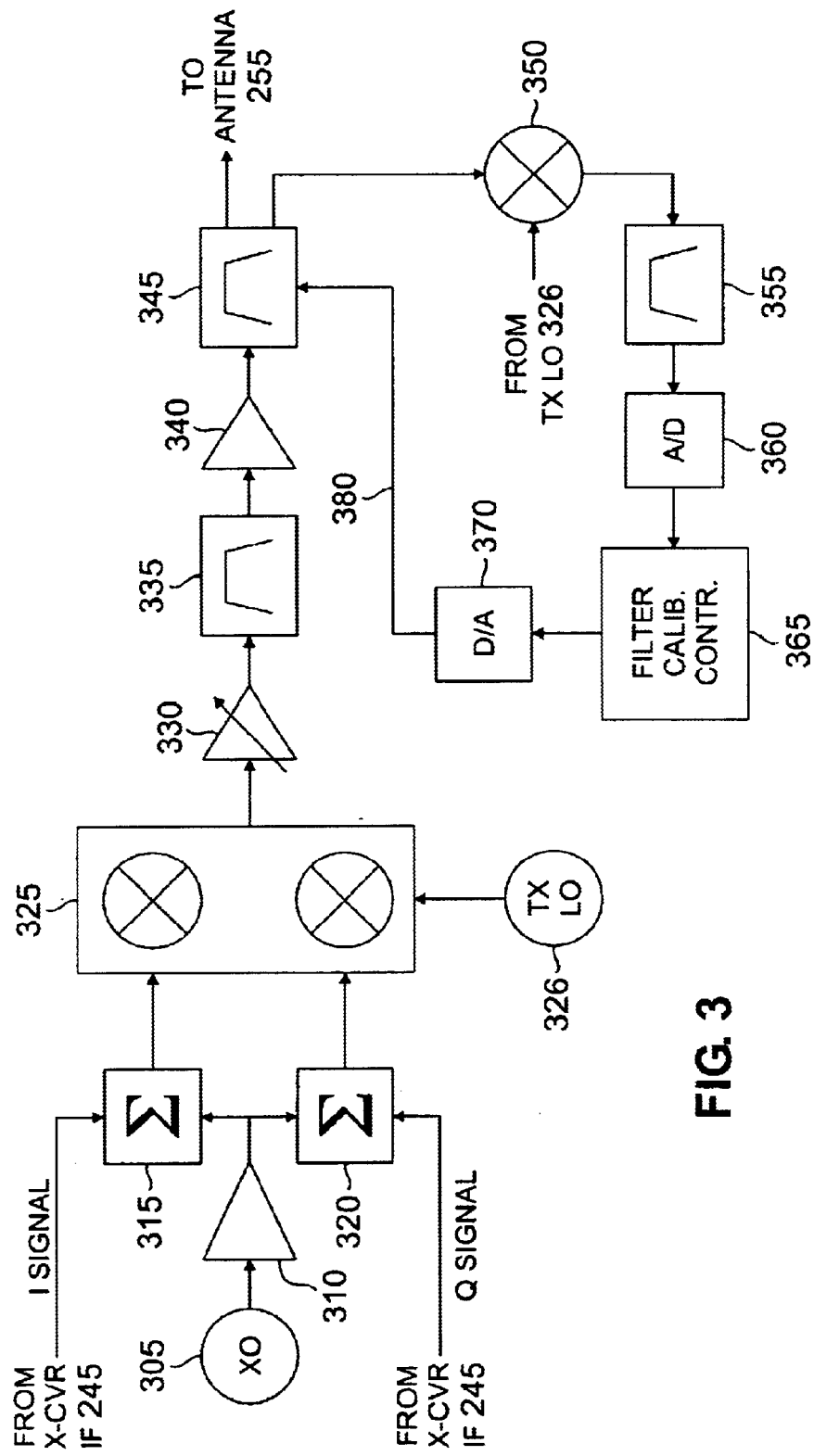
FIG. 3 illustrates in greater detail a portion of an exemplary RF transceiver unit in accordance with an advantageous embodiment of the present invention.

FIG. 3 illustrates in greater detail a transmit portion of exemplary RF transceiver unit 250 in accordance with one embodiment of the present invention. RF transceiver unit 250 contains an RF transmit (forward channel) signal path comprising crystal oscillator (XO) 305, amplifier 310, summation circuit 315, summation circuit 320, direct modulator 325, transmit local oscillator (TX LO) 326, power amplifier (PA) 330, bandpass filter (filter) 335, power amplifier (PA) 340, and tunable cavity filter (tunable filter) 345. Crystal oscillator (XO) 305, amplifier 310, summation circuit 315, summation circuit 320, and direct modulator 325 comprise a filter calibration signal injection circuit that combines an input filter calibration signal with a first RF signal in the RF transmit (forward channel) signal path of RF transceiver unit 250. Crystal oscillator (XO) 305 generates an exemplary 2.25 MHz filter calibration signal that is amplified by amplifier 310.

RF transceiver unit 250 also contains a filter calibration circuit comprising RF mixer 350, narrowband filter 355, analog-to-digital (A/D) converter 360, filter calibration controller 365, and digital-to-analog (D/A) converter 370. The filter calibration circuit determines the signal level of an output filter calibration signal from tunable narrowband cavity filter 345. The output filter calibration signal corresponds to the input filter calibration signal. The output filter calibration signal is a modified form of the input filter calibration signal that results after the input filter calibration signal has passed through tunable narrowband cavity filter 345. The filter calibration circuit uses information concerning the signal levels of the input filter calibration signal and the output filter calibration signal to determine control signals for adjusting a center frequency of pass band of the tunable narrowband cavity filter 345.

Summation circuit 315 adds the in-phase (I) baseband signal from transceiver IF 245 and the amplified filter calibration signal from amplifier 310 to produce an output signal that is a combination of the I signal and the amplified filter calibration signal. The frequency of the amplified filter calibration signal determines the off-set frequency separation between the two summed signals. In an exemplary advantageous embodiment of the present invention, an exemplary 2.25 MHz filter calibration signal is generated by crystal oscillator (XO) 305. The exemplary 2.25 MHz frequency is chosen for crystal oscillator (XO) 305 in order to ensure that the forward channel from RF transceiver unit 250 meets the CDMA requirement that adjacent channel products (ACP) or intermodulation (intermod) products that are generated by a base station transmitter at a 2.25 MHz off-set from the center frequency of the transmit channel are at least 15 dB below the maximum power output.

In a similar manner, summation circuit 320 adds the quadrature (Q) phase baseband signal from transceiver IF 245 and the amplified 2.25 MHz filter calibration signal from amplifier 310 to produce an output signal that is a combination of the Q signal and the amplified filter calibration signal. Amplifier 310 provides an amplified filter calibration signal that ideally is at least 40 dB lower than the forward channel power of the I signal and the Q signal at the output of summation circuits 315 and 320. The 40 dB difference between the I and Q baseband signals and the amplified filter calibration signal ensures that the signal level of the filter calibration signal will not interfere with forward channel traffic information.

Figure 4:
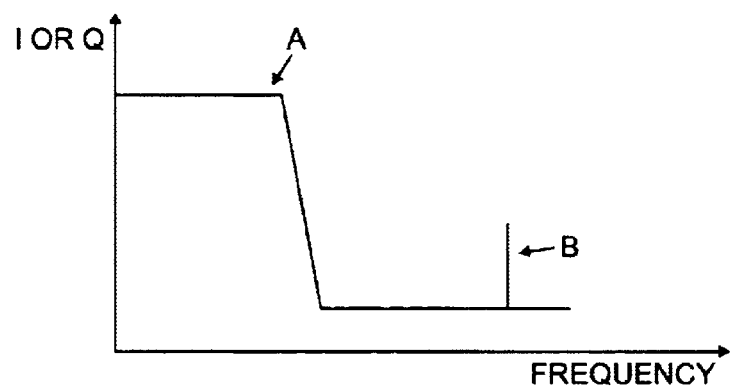
FIG. 4 is an exemplary frequency spectrum diagram of the output signals generated by the two summation circuits according to one embodiment of the present invention.

FIG. 4 is an exemplary frequency spectrum diagram of the output signals generated by summation circuit 315 and summation circuit 320 according to one embodiment of the present invention. The signal level labeled "A" in the diagram represents the signal level of the I or Q components received from transceiver IF 245. The signal level labeled "B" represents the signal level of the exemplary 2.25 MHz filter calibration signal component received from amplifier 310.

Direct modulator 325 modulates the I and Q signals and the filter calibration signals from summation circuit 315 and summation circuit 320 with the carrier signal generated by transmitter local oscillator (TX LO) 326 and combines the modulated signals into a single radio frequency (RF) output. The frequency of TX LO 326 is the center frequency of the transmit channel assigned to BS 101. In an exemplary embodiment of the present invention, the output of TX LO 326 is a 1960 MHz carrier signal that is the center frequency of a 1.23 MHz wide CDMA transmit channel.

Figure 5:
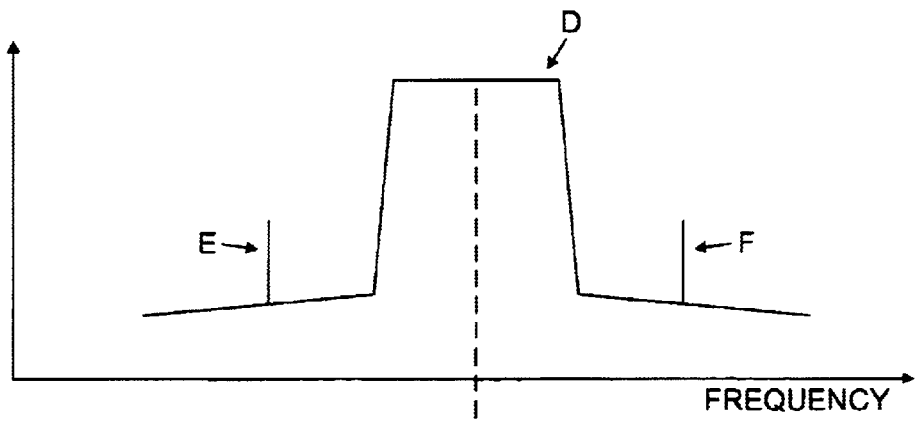
FIG. 5 is an exemplary frequency spectrum diagram of the output signal generated by the exemplary direct modulator according to one embodiment of the present invention.

FIG. 5 is an exemplary frequency spectrum diagram of the output signal generated by direct modulator 325 according to one embodiment of the present invention. The dotted vertical line represent the exemplary 1960 MHz center frequency of the channel. The signal level identified as "D" represents the signal levels of the sidebands of the modulated I and Q components at the output of direct modulator 325. The signal level labeled "E" represents the signal level of a lower sideband caused by the 2.25 MHz filter calibration signal. The signal level labeled "F" represents the signal level of an upper sideband caused by the 2.25 MHz filter calibration signal. It is noted that the upper and lower sidebands caused by the filter calibration signal straddle the frequencies of interest containing the I signal and Q signal information. The upper and lower sidebands may, therefore, be used to center the tunable narrowband cavity filter around the frequencies of interest containing the I signal and Q signal information, as described below in greater detail.

Power amplifier (PA) 330, bandpass filter 335, and power amplifier (PA) 340 amplify and filter the output signal from direct modulator 325. In one embodiment of the present invention, filter 335 is a bandpass filter that passes signals in the CDMA range of 1930 MHz to 1990 MHz while rejecting other signals. In an alternate embodiment of the present invention, filter 335 may be selected to pass only signals within a 1.23 MHz wide pass band at a selected CDMA center frequency, as well as the ±2.25 MHz sideband filter calibration signals.

The output signal from power amplifier (PA) 340 is provided as an input signal to tunable filter 345. In an advantageous embodiment of the present invention, tunable filter 345 is a narrowband cavity-type filter that changes its bandpass frequency as a function of the voltage level on its control voltage input. Tunable filter 345 maintains a bandpass filter for a pre-determined fixed frequency when its control voltage is at a given reference voltage ($V_{REF}$). As the control voltage varies above or below the pre-determined reference voltage $V_{REF}$, tunable filter 345 correspondingly increases or decreases the center frequency of its pass band. In an exemplary embodiment of the present invention, tunable filter 345 has a tuning range of 1930 MHz to 1990 MHz with a 1.23 MHz wide pass band. The center of the pass band of tunable filter 345 is tuned to the center frequency of the assigned transmit channel, namely 1960 MHz. In an advantageous embodiment of the present invention, tunable filter 345 provides at least 15 dB of rejection for signal components that are off-set ±2.25 MHz from the center frequency of the assigned transmit channel.

Tunable filter 345 generates two identical outputs. One output is transferred to antenna array 255. The other output is coupled to a first input of RF mixer 350. RF mixer 350 also receives the carrier reference signal from TX LO 326. RF mixer 350 down-converts (demodulates) the signal from the coupled port of tunable filter 345 to produce a demodulated output. The demodulated output of RF mixer is similar to the frequency spectrum diagram illustrated in FIG. 4, including a first component (labeled "A") in the 0–660 KHz range caused by the energy of the demodulated I and Q baseband signals and a second component (labeled "B") at 2.25 MHz caused by the combined energy of the two filter calibration signal sidebands.

When tunable filter 345 is ideally centered at the frequency of TX LO 326 (1960 MHz in the exemplary embodiment), each 2.25 MHz sideband at the output of tunable filter 345 has the same amplitude and each sideband is minimized. The amplitude is at least 15 dB down from the maximum power level that can be passed by tunable filter 345.

Filter 355 is a narrowband high-Q filter that is centered to pass the composite output sideband at the off-set frequency of crystal oscillator (XO) 305. In an exemplary advantageous embodiment, filter 355 is centered at 2.25 MHz. Analog-to-digital (A/D) converter 360 converts the output from filter 355 to a digitized signal for input to filter calibration controller 365.

Figure 6:
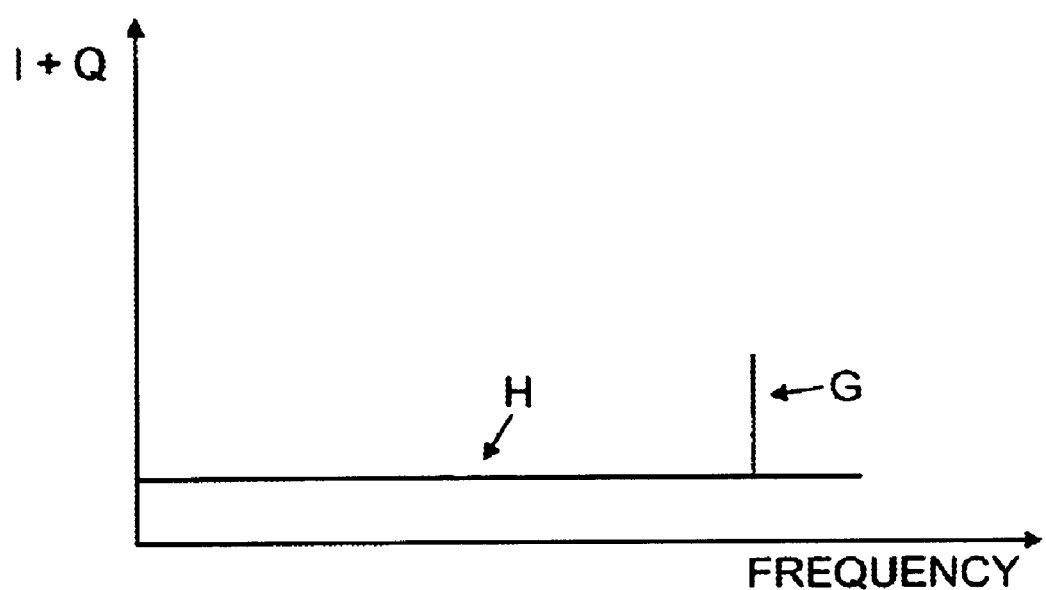
FIG. 6 is an exemplary frequency spectrum diagram showing the output signal generated at the output of the filter in the control feedback loop according to one embodiment of the present invention.

FIG. 6 is an exemplary frequency spectrum diagram showing the signal generated at the output of filter 355 in the control feedback loop according to one embodiment of the present invention. The signal level labeled "G" represents the signal level of the 2.25 MHz signal caused by the combined energy of the demodulated upper and lower filter calibration signal sidebands. Filter 355 has removed the signal energy caused by the demodulated I and Q components at the output of RF mixer 350. Thus, only noise (labeled "H") remains in the 0–660 KHz frequency range.

Filter calibration controller 365 operates under the direction of internal software to compare the output from analog-to-digital (A/D) converter 360 with control characteristics associated with tunable filter 345. Filter calibration controller 365 generates digital control signals that determine whether tunable filter 345 is to be maintained at its present frequency, moved to a higher frequency, or moved to a lower frequency. Filter calibration controller 365 also generates digital control signals that control the rate at which tunable filter 345 changes frequency. Digital-to-analog (D/A) converter 370 converts the digital control signals from filter calibration controller 365 to the appropriate control voltages for changing the operating frequency of tunable filter 345 and for changing the rate at which tunable filter 345 changes frequency. Digital to analog (D/A) converter 370 transfers the control voltages to tunable filter 345 through control line 380.

As noted above, when tunable filter 345 is ideally centered at the frequency of TX LO 326 (1960 MHz in the exemplary embodiment), each 2.25 MHz filter calibration signal sideband at the output of tunable filter 345 has the same amplitude and the total signal energy of both filter calibration signal sidebands is minimized. However, if tunable filter 345 is not centered at the frequency of TX LO 326 (1960 MHz in the exemplary embodiment), one of the 2.25 MHz sidebands at the output of tunable filter 345 will be much larger and the total signal energy of both filter calibration signal sidebands will no longer be minimized. To calibrate tunable filter 345, filter calibration controller 365 adjusts the center frequency of tunable filter 345 in order to minimize the level of the 2.25 MHz signal at the output of RF mixer 350, thereby minimizing the combined energy of the filter calibration signal sidebands.

Initially, when BS 101 is placed in service, filter calibration controller 365 may receive an initial zero voltage from analog-to digital (A/D) converter 360 and determine that no 2.25 MHz sideband is present on the output of filter 355. This condition may also exist when tunable filter 345 is tuned far outside the output frequency of TX LO 326. Under this condition, filter calibration controller 365 executes a search algorithm by varying the control voltage at the output of D/A converter 370 through a range of values. The varying control voltage causes tunable filter 345 to scan through a range of frequencies until the filter calibration signal received from RF mixer 350 is located.

Figure 7:
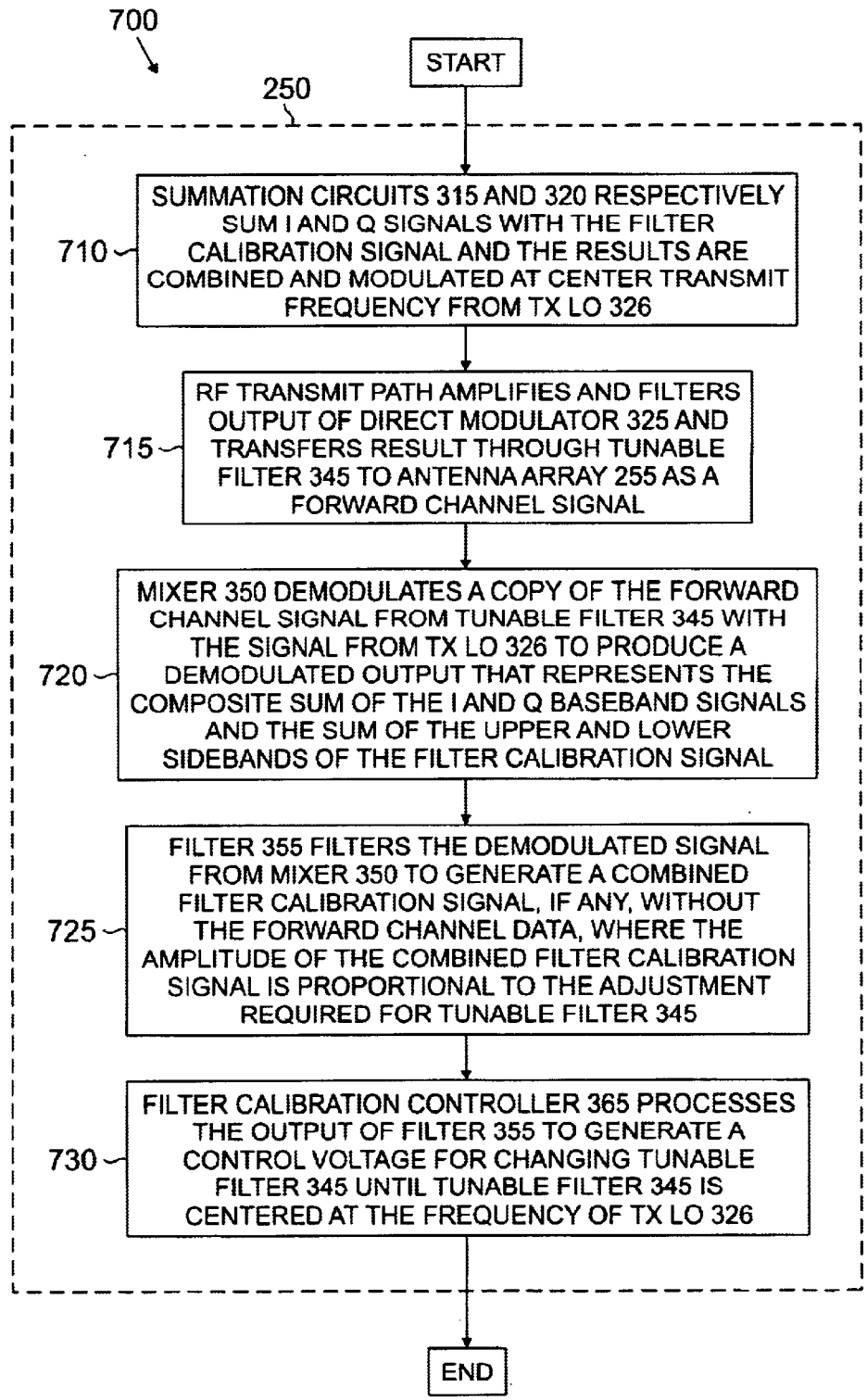
FIG. 7 is a flow diagram illustrating the operation of the exemplary RF transceiver unit in accordance with one embodiment of the present invention.

FIG. 7 depicts exemplary flow diagram 700, which illustrates the operation of RF transceiver unit 250 in accordance with one embodiment of the present invention. Initially, summation circuit 315 and summation circuit 320, respectively, sum a 2.25 MHz filter calibration signal with I and Q forward channel traffic data from transceiver IF 245. Direct modulator 325 combines and modulates the results from the summation process with the center transmit frequency signal provided by TX LO 326 to produce a modulated forward channel signal with two sidebands off-set 2.25 MHz from the center transmit frequency of the selected transmit channel (process step 710).

The RF transmit path then amplifies and filters the modulated signal from direct modulator 325 to provide a forward channel signal for input to tunable filter 345. Tunable filter 345 applies its baseband filter to generate a forward channel signal for transfer to antenna array 255 (process step 715). Tunable filter 345 also provides a copy of the resultant forward channel signal as an input to RF mixer 350. RF mixer 350 demodulates the copy of the forward channel signal from tunable filter 345 with the center transmit frequency signal from TX LO 326 to produce an output signal that represents the composite sum of the I and Q baseband signals with the sum of the upper and lower sidebands, if any, appearing at a 2.25 MHz off-set from the center transmit frequency (process step 720).

Filter 355 then receives the demodulated output from RF mixer 350 and filters out signals other than those appearing at the off-set 2.25 MHz output filter calibration frequency to provide an output filter calibration signal for adjusting tunable filter 345. The output provided by filter 355 is proportional to the adjustments required for centering tunable filter 345 at the center transmit frequency of the selected transmit channel (process step 725).

Next, the output of filter 355 is transferred to ADC 360 and filter calibration controller 365. Filter calibration controller 365 compares the signal level of the output filter calibration signal that is output by filter 355 with values of signal levels stored within internal software of filter calibration controller 365. Filter calibration controller 365 generates and outputs a control signal to change a control voltage to be applied to tunable filter 345 to adjust the output of tunable filter 345 until tunable filter 345 is centered at the center transmit frequency of TX LO 346 (process step 730).

Specifically, if the signal level of the output filter calibration signal from filter 355 matches the specified 2.25 MHz signal level transferred by tunable filter 345 when it is properly centered, no further tuning adjustments are made. If the signal level of the output filter calibration signal from filter 355 is higher than desired, filter calibration controller 365 generates a control signal to increase the control voltage that is transferred to tunable filter 345. The control voltage is increased in incremental steps until filter calibration controller 365 detects an increase or a decrease in the signal level of the output filter calibration signal from filter 355. If the detected change is an increase in signal level, filter calibration controller 365 then decreases the control signal to decrease the control voltage to tunable filter 345. This causes tunable filter 345 to change the tuning direction within tunable filter 345. Filter calibration controller 365 continues to decrease the control voltage in incremental steps until the signal level of the output filter calibration signal from filter 355 is minimized. Minimization of the output filter calibration signal from filter 355 indicates that tunable filter 345 is tuned to the center transmit frequency for the selected channel.

If filter calibration controller 365 initially detects a decrease in the signal level of the output filter calibration signal from filter 355, filter calibration controller 365 continues to increase the control voltage to tunable filter 345 until the signal level of the output filter calibration signal from 355 is minimized and tunable filter 345 is properly tuned and centered at the center transmit frequency.

When filter calibration controller 365 decreases the control signal output to DAC 370 and subsequently receives an increase in the signal level of the output filter calibration signal from filter 355, filter calibration controller starts increasing the control signal output to DAC 370 until the output filter calibration signal from filter 355 is minimized. As before, minimization of the output filter calibration signal indicates that tunable filter 345 is properly tuned and centered at the center transmit frequency.

The tunable filter 345 covers the whole transmit frequency range of an RF transmitter with one filter. The tunable filter 345 replaces the numerous individual prior art filters that are required to cover particular transmit channels. The replacement of many individual prior art filters by tunable filter 345 directly reduces manufacturing costs by eliminating the prior art output filters.

In addition, the use of tunable filter 345 reduces power consumption compared to the level of power consumption of the prior art filters. In particular, because tunable filter 345 can be used to reject adjacent channel products throughout a broad range of frequencies, then a less linear power amplifier may be used in the transmitter. If a less linear power amplifier may be used in the transmitter, then less power is needed to operate the less linear power amplifier. The use of less power means that less thermal heat will be generated in the power amplifier chassis. The use of tunable filter 345 will reduce both power consumption and heat production.

Although the present invention has been described in detail, those skilled in the art should understand that they can make various changes, substitutions and alterations herein without departing from the spirit and scope of the invention in its broadest form.

What is claimed is:

1. A radio frequency (RF) transmitter comprising:
   modulation circuitry capable of modulating an input baseband signal to produce a first RF signal;
   amplification circuitry capable of amplifying said first RF signal;
   a tunable narrowband cavity filter capable of filtering said amplified first RF signal and transmitting said filtered and amplified first RF signal to an antenna coupled to an output of said tunable narrowband cavity filter; and
   a system for tuning said tunable narrowband cavity filter comprising:
      a filter calibration signal injection circuit capable of combining an input calibration signal with said input baseband signal; and
      a filter calibration circuit coupled to said output of said tunable narrowband cavity filter capable of detecting an RF output calibration signal corresponding to said input calibration signal, determining a signal level of said RF output calibration signal, and adjusting a center frequency of a pass band of said tunable narrowband cavity filter in response to said signal level determination.

2. The RF transmitter as set forth in claim 1 wherein said filter calibration signal injection circuit comprises:
   a signal source capable of generating said input calibration signal;
   a first summation circuit coupled to said signal source capable of combining said input calibration signal with an in-phase baseband signal to produce a first summed signal; and a second summation circuit coupled to said signal source capable of combining said input calibration signal with a quadrature baseband signal to produce a second summed signal.

3. The RF transmitter as set forth in claim 2 wherein said modulation circuitry combines and modulates said first and second summed signals to produce said first RF signal.

4. The RF transmitter as set forth in claim 3 wherein a level of said input calibration signal is at least 40 dB lower than a level of said in-phase baseband signal and wherein said level of said input calibration signal is at least 40 dB lower than a level of said quadrature baseband signal.

5. The RF transmitter as set forth in claim 1 wherein said filter calibration circuit comprises:
- an RF mixer capable of receiving said RF output calibration signal from said tunable narrowband cavity filter and demodulating said RF output calibration signal to produce a demodulated baseband calibration signal; and
- a filter calibration controller capable of receiving said demodulated baseband calibration signal, determining a signal level of said demodulated baseband calibration signal, and adjusting said center frequency of said pass band of said tunable narrowband cavity filter according to said signal level of said demodulated baseband calibration signal.

6. The RF transmitter as set forth in claim 5 wherein said RF output calibration signal comprises an upper RF calibration signal disposed at approximately X Hz above a center frequency of said filtered and amplified first RF signal and a lower RF calibration signal disposed at approximately X Hz below said center frequency of said filtered and amplified first RF signal.

7. The RF transmitter as set forth in claim 6 wherein said RF mixer demodulates said upper and lower RF calibration signals to produce said demodulated baseband calibration signal, wherein said signal level of said demodulated baseband calibration signal is proportional to a combined signal level of said upper and lower RF calibration signals.

8. The RF transmitter as set forth in claim 7 wherein said filter calibration controller adjusts said center frequency of said pass band of said tunable narrowband cavity filter to minimize said signal level of said demodulated baseband calibration signal.

9. A wireless network comprising:
- a plurality of base stations, each of said base stations capable of communicating with a plurality of mobile stations, at least one of said base stations comprising:
  an antenna; and
  a radio frequency (RF) transmitter comprising:
    modulation circuitry capable of modulating an input baseband signal to produce a first RF signal;
    amplification circuitry capable of amplifying said first RF signal;
    a tunable narrowband cavity filter capable of filtering said amplified first RF signal and transmitting said filtered and amplified first RF signal to an antenna coupled to an output of said tunable narrowband cavity filter; and
    a system for tuning said tunable narrowband cavity filter comprising:
      a filter calibration signal injection circuit capable of combining an input calibration signal with said input baseband signal; and
      a filter calibration circuit coupled to said output of said tunable narrowband cavity filter capable of detecting an RF output calibration signal corresponding to said input calibration signal, determining a signal level of said RF output calibration signal, and adjusting a center frequency of a pass band of said tunable narrowband cavity filter in response to said signal level determination.

10. The wireless network as set forth in claim 9 wherein said filter calibration signal injection circuit comprises:
- a signal source capable of generating said input calibration signal;
- a first summation circuit coupled to said signal source capable of combining said input calibration signal with an in-phase baseband signal to produce a first summed signal; and
- a second summation circuit coupled to said signal source capable of combining said input calibration signal with a quadrature baseband signal to produce a second summed signal.

11. The wireless network as set forth in claim 10 wherein said modulation circuitry combines and modulates said first and second summed signals to produce said first RF signal.

12. The wireless network as set forth in claim 11 wherein a level of said input calibration signal is at least 40 dB lower than a level of said in-phase baseband signal and wherein said level of said input calibration signal is at least 40 dB lower than a level of said quadrature baseband signal.

13. The wireless network as set forth in claim 9 wherein said filter calibration circuit comprises:
- an RF mixer capable of receiving said RF output calibration signal from said tunable narrowband cavity filter and demodulating said RF output calibration signal to produce a demodulated baseband calibration signal; and
- a filter calibration controller capable of receiving said demodulated baseband calibration signal, determining a signal level of said demodulated baseband calibration signal, and adjusting said center frequency of said pass band of said tunable narrowband cavity filter according to said signal level of said demodulated baseband calibration signal.

14. The wireless network as set forth in claim 13 wherein said RF output calibration signal comprises an upper RF calibration signal disposed at approximately X Hz above a center frequency of said filtered and amplified first RF signal and a lower RF calibration signal disposed at approximately X Hz below said center frequency of said filtered and amplified first RF signal.

15. The wireless network as set forth in claim 14 wherein said RF mixer demodulates said upper and lower RF calibration signals to produce said demodulated baseband calibration signal, wherein said signal level of said demodulated baseband calibration signal is proportional to a combined signal level of said upper and lower RF calibration signals.

16. The wireless network as set forth in claim 15 wherein said filter calibration controller adjusts said center frequency of said pass band of said tunable narrowband cavity filter to minimize said signal level of said demodulated baseband calibration signal.

17. For use in a radio frequency (RF) transmitter comprising 1) modulation circuitry capable of modulating an input baseband signal to produce a first RF signal, 2) amplification circuitry capable of amplifying the first RF signal, and 3) a tunable narrowband cavity filter capable of filtering the amplified first RF signal and transmitting the filtered and amplified first RF signal to an antenna coupled to an output of the tunable narrowband cavity filter, a method of tuning the tunable narrowband cavity filter comprising the steps of:

combining an input calibration signal with the input baseband signal at the input of the modulation circuitry;

detecting at the output of the tunable narrowband cavity filter an RF output calibration signal corresponding to the input calibration signal;

determining a signal level of the RF output calibration signal; and adjusting a center frequency of a pass band of the tunable narrowband cavity filter in response to the signal level determination.

18. The method as set forth in claim 17 wherein the step of combining an input calibration signal with the input baseband signal filter comprises the sub-steps of:

generating the input calibration signal;

combining the input calibration signal with an in-phase baseband signal to produce a first summed signal; and combining the input calibration signal with a quadrature baseband signal to produce a second summed signal.

19. The method as set forth in claim 18 wherein the modulation circuitry combines and modulates the first and second summed signals to produce the first RF signal.

20. The method as set forth in claim 19 wherein a level of the input calibration signal is at least 40 dB lower than a level of the in-phase baseband signal and wherein the level of the input calibration signal is at least 40 dB lower than a level of the quadrature baseband signal.

21. The method as set forth in claim 17 wherein the steps of detecting, determining and adjusting comprise the sub-steps of:

demodulating the RF output calibration signal to produce a demodulated baseband calibration signal;

determining a signal level of the demodulated baseband calibration signal; and adjusting the center frequency of the pass band of the tunable narrowband cavity filter according to the signal level of the demodulated baseband calibration signal.

22. The method as set forth in claim 21 wherein the RF output calibration signal comprises an upper RF calibration signal disposed at approximately X Hz above a center frequency of the filtered and amplified first RF signal and a lower RF calibration signal disposed at approximately X Hz below the center frequency of the filtered and amplified first RF signal.

23. The method as set forth in claim 22 wherein the step of demodulating the RF output calibration signal comprises the sub-step of demodulating the upper and lower RF calibration signals to produce the demodulated baseband calibration signal, wherein the signal level of the demodulated baseband calibration signal is proportional to a combined signal level of the upper and lower RF calibration signals.

24. The method as set forth in claim 23 wherein the step of adjusting the center frequency of the pass band filter comprises the sub-step of adjusting the center frequency of the pass band of the tunable narrowband cavity filter to minimize the signal level of the demodulated baseband calibration signal.

* * * * *